(12) United States Patent
Chen et al.

(10) Patent No.: US 7,934,053 B2
(45) Date of Patent: Apr. 26, 2011

(54) FLASH MEMORY STORAGE DEVICE FOR ADJUSTING EFFICIENCY IN ACCESSING FLASH MEMORY

(75) Inventors: Ju-peng Chen, Taipei (TW); Nei-chiung Perng, Taipei (TW)

(73) Assignee: Genesys Logic, Inc., Shindian (TW)

( * ) Notice: Subject to any disclaimer, the term of this patent is extended or adjusted under 35 U.S.C. 154(b) by 472 days.

(21) Appl. No.: 12/103,863

(22) Filed: Apr. 16, 2008

(65) Prior Publication Data

US 2009/0204746 A1    Aug. 13, 2009

(30) Foreign Application Priority Data

Feb. 13, 2008 (TW) ............................... 97104935 A

(51) Int. Cl.
*G06F 12/00* (2006.01)
(52) U.S. Cl. ..................... 711/103; 365/185.33

(58) Field of Classification Search ............... 711/103; 365/185.33
See application file for complete search history.

(56) References Cited

U.S. PATENT DOCUMENTS

| | | | |
|---|---|---|---|
| 2007/0016756 | A1 | 1/2007 | Hsieh et al. |
| 2007/0028033 | A1 | 2/2007 | Hsieh et al. |
| 2008/0104309 | A1* | 5/2008 | Cheon et al. ............ 711/103 |
| 2008/0126680 | A1* | 5/2008 | Lee et al. ............... 711/103 |
| 2008/0215800 | A1* | 9/2008 | Lee et al. ............... 711/103 |
| 2008/0244164 | A1* | 10/2008 | Chang et al. ............ 711/103 |

* cited by examiner

*Primary Examiner* — Hashem Farrokh
(74) *Attorney, Agent, or Firm* — Kirton & McConkie; Evan R. Witt

(57) ABSTRACT

A flash memory storage device for boosting efficiency in accessing flash memory is disclosed. The flash memory storage device provides a Multi-level cell (MLC) flash memory for storing data, a single-level cell (SLC) flash memory for storing data, and a control unit for determining whether to store a file into the MLC NAND flash memory or a SLC NAND flash memory based on the file's data characteristics.

4 Claims, 5 Drawing Sheets

FLASH MEMORY STORAGE DEVICE FOR ADJUSTING EFFICIENCY IN ACCESSING FLASH MEMORY

BACKGROUND OF THE INVENTION

1. Field of the Invention

The present invention relates to a flash memory storage system, and more particularly, to a flash memory storage system capable of facilitating access efficiency.

2. Description of the Related Art

Flash Memory, a non-volatile memory, keeps the previously stored written data upon shutdown. In contrast to other storage media, e.g. hard disk, soft disk, magnetic tape and so on, the flash memory has advantages of small volume, light weight, vibration-proof, low power consumption, and no mechanical movement delay in data access, therefore, the flash memory are for wide use as storage media in consumer electronic devices, embedded systems, or portable computers.

There are two kinds of flash memory: one is an NOR flash memory and the other is an NAND flash memory. An NOR flash memory is characteristically of low driving voltage, fast access speed, high stability, and are widely applied in portable electrical devices and communication devices, such as Personal Computers (PC), mobile phones, personal digital assistances (PDA), and set-top boxes (STB). An NAND flash memory is specifically designed as data storage media, for example, a Secure Digital (SD) memory card, a Compact Flash (CF) card, a memory Stick (MS) card. Upon writing, erasing and reading, charges move across a floating gate relying on charge coupling which determines a threshold voltage of a transistor under the floating gate. In other words, in response to an injection of electrons into the floating gate, the logical status of the floating gate turns from 1 to 0; on the contrary, in response to move electrons away from the floating gate, the logical status of the floating gate turns from 0 to 1.

The NAND flash memory contains a plurality of blocks, each block having a plurality of pages and each page dividing into a data area and a spare area. The data area which may have 512 bytes is used for storing data. The spare area is used for storing error correction code (ECC). However, the flash memory fails to change data update-in-place, that is, prior to writing data into a non-blank page, erasing a block including the non-blank page is required. In general, erasing a block take as much time as 10-20 times greater as writing into a page. If a size of written data is over an assigned block, the filled pages in the assigned block have to be removed to other blocks, and then erasing the assigned block is performed.

Furthermore, flash memory block may fail to access when in excess of one million times of erasures before the block is considered to be worn out. This is because the number of erasure times for a block is close to one million, charge within the floating gate may be insufficient due to current leakage of realized capacitor, thereby resulting in data loss of the flash memory cell, and even failure to access the flash memory. In other words, if erased over a limited times, a block may be unable to be accessed.

There are two kinds of NAND flash memory: one is a multi-level cell (MLC) NAND flash memory and the other is a single-level cell (SLC) flash memory. A cell of the MLC NAND flash memory includes a floating gate for storing various charge levels indicative of binary value 00, 01, 10, and 11. Therefore, each MLC NAND flash memory cell can store four values one time. Conversely, the SLC NAND flash memory cell has thinner oxide film between the floating gate and the source. During writing process, voltage is applied onto the floating gate, thereby the stored charge being driven to flow out through the source. Each SLC NAND flash memory cell may store only one-bit data, as is less than MLC NAND flash memory cell. In addition, a speed of an access to the MLC NAND flash memory is faster than that to the SLC NAND flash memory cell. Nevertheless, a number of access to the SLC NAND flash memory may be one hundred thousand times, while the MLC NAND flash memory can be accessed by ten thousand times. That is, a life of the MLC NAND flash memory is shorter than that of SLC NAND flash memory. Moreover, the MLC NAND flash memory consumes more power than the SLC NAND flash memory by about 15%.

Please refer to FIG. 1 and FIG. 2. FIG. 1 shows a diagram of a storage memory device using SLC NAND flash memory, and FIG. 2 shows a diagram of a storage memory device using MLC NAND flash memory. At present, the storage devices 70 using the MLC NAND flash memory are almost low access speed. The storage device 70 accesses multiple MLC NAND flash memory areas 74 by means of the controller 72. Conversely, the storage devices 80 using the SLC NAND flash memory are almost used in high performance memory card. The storage device 80 accesses multiple SLC NAND flash memory areas 84 by means of the controller 82. Because the demands for the flash memory storage device are different, it is necessary to develop a flash memory device capable of determining to store a file into the MLC NAND flash memory or a SLC NAND flash memory to meet the user desires.

SUMMARY OF THE INVENTION

It is therefore an object of the present invention to provide a flash memory storage system capable of facilitating access efficiency, by determining to store a file into the MLC NAND flash memory or a SLC NAND flash memory based on the file's data characteristics.

Briefly summarized, the flash memory storage device provides a Multi-level cell(MLC) flash memory for storing data, a single-level cell (SLC) flash memory for storing data, and a control unit for determining to store a file into the MLC NAND flash memory or a SLC NAND flash memory based on the file's data characteristics.

In one aspect of the present invention, if the size of the file exceeds a predetermined value, the control unit controls the file to store in the MLC NAND flash memory, otherwise, the control unit controls the file to store in the SLC NAND flash memory.

In another aspect of the present invention, if the file is a video file or an audio file, the control unit controls the file to store in the MLC NAND flash memory. If the file is a configuration file, the control unit controls the file to store in the SLC NAND flash memory.

The present invention will be described with reference to the accompanying drawings, which show exemplary embodiments of the present invention.

DETAILED DESCRIPTION OF THE INVENTION

Figure 1:
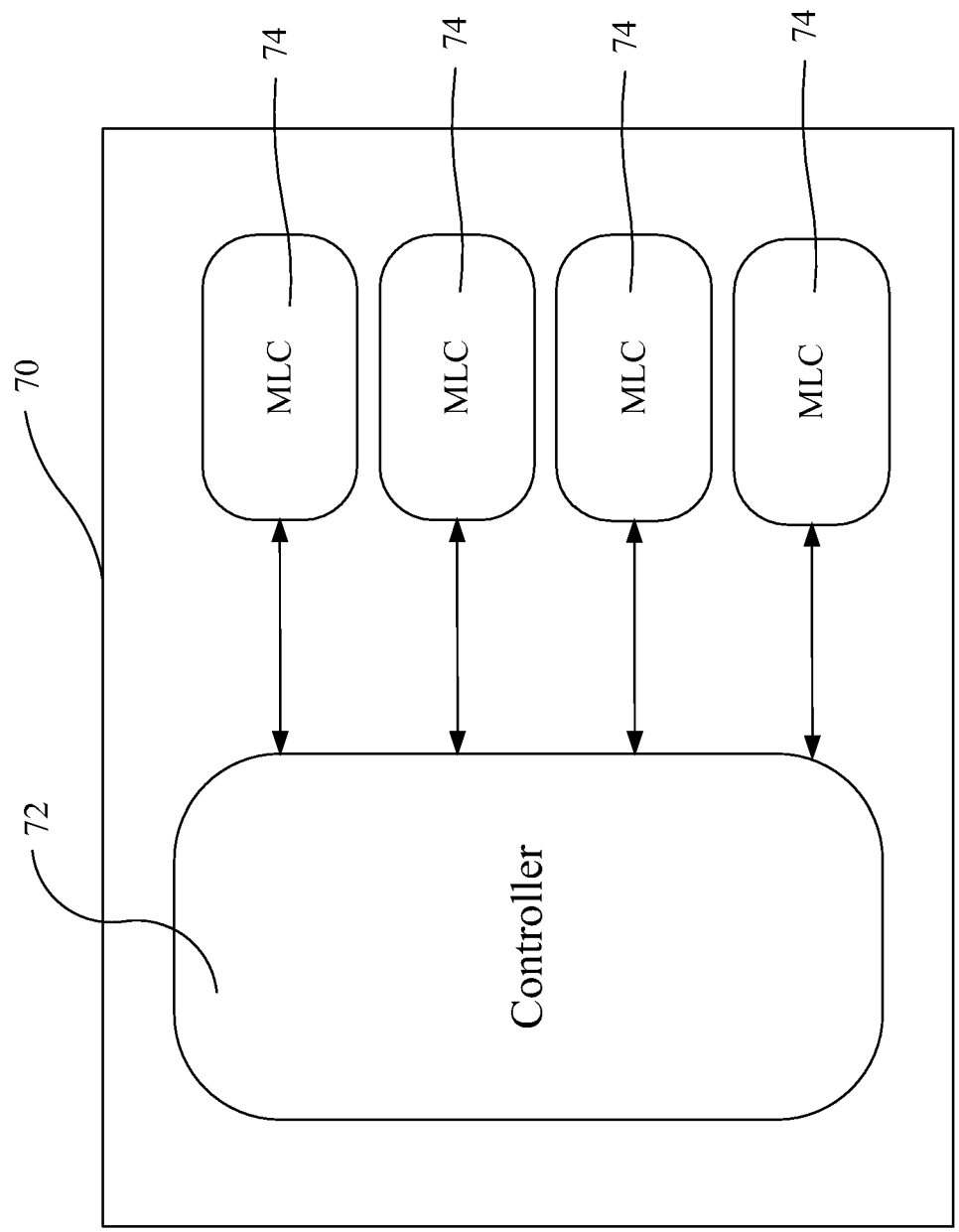
FIG. 1 shows a diagram of a storage memory device using SLC NAND flash memory.
Figure 2:
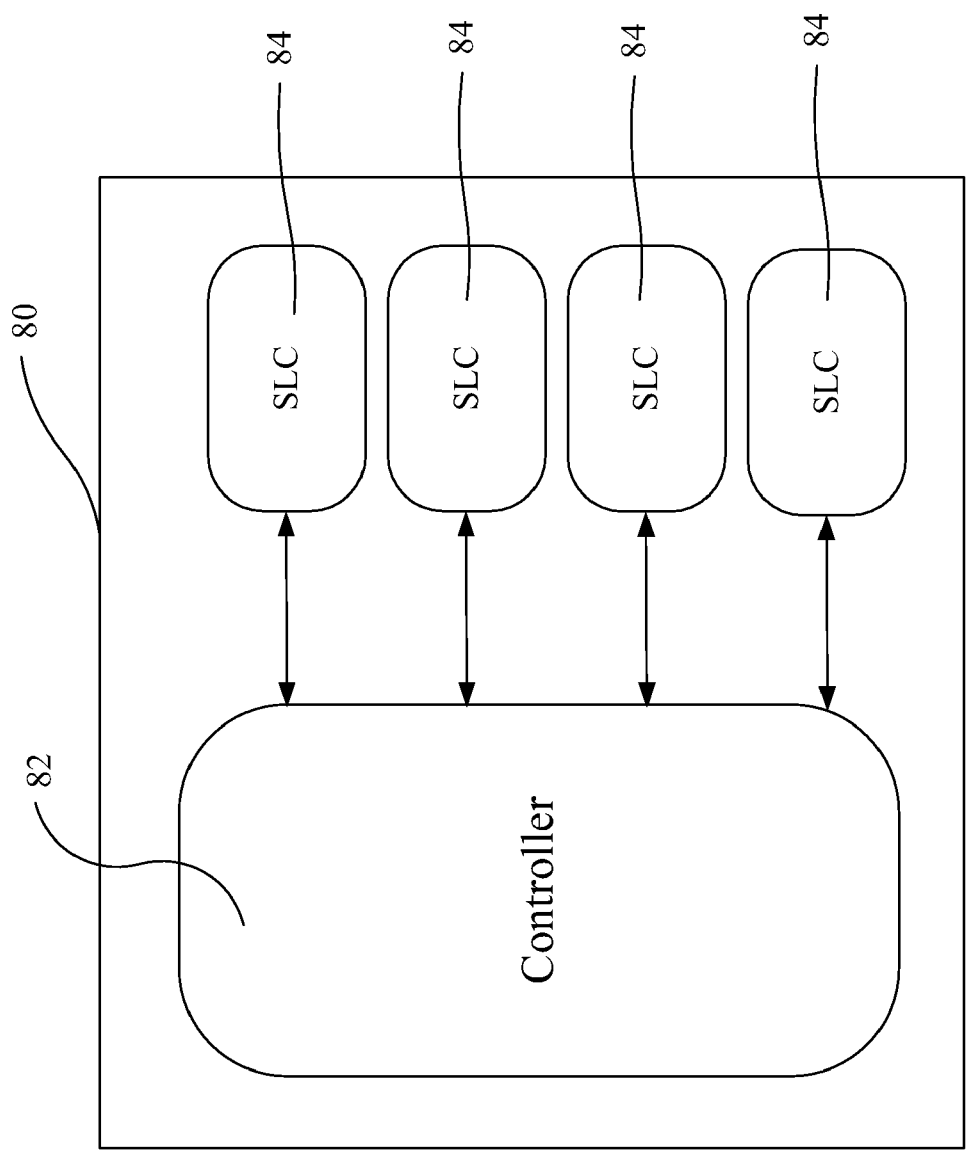
FIG. 2 shows a diagram of a storage memory device using MLC NAND flash memory.
Figure 3:
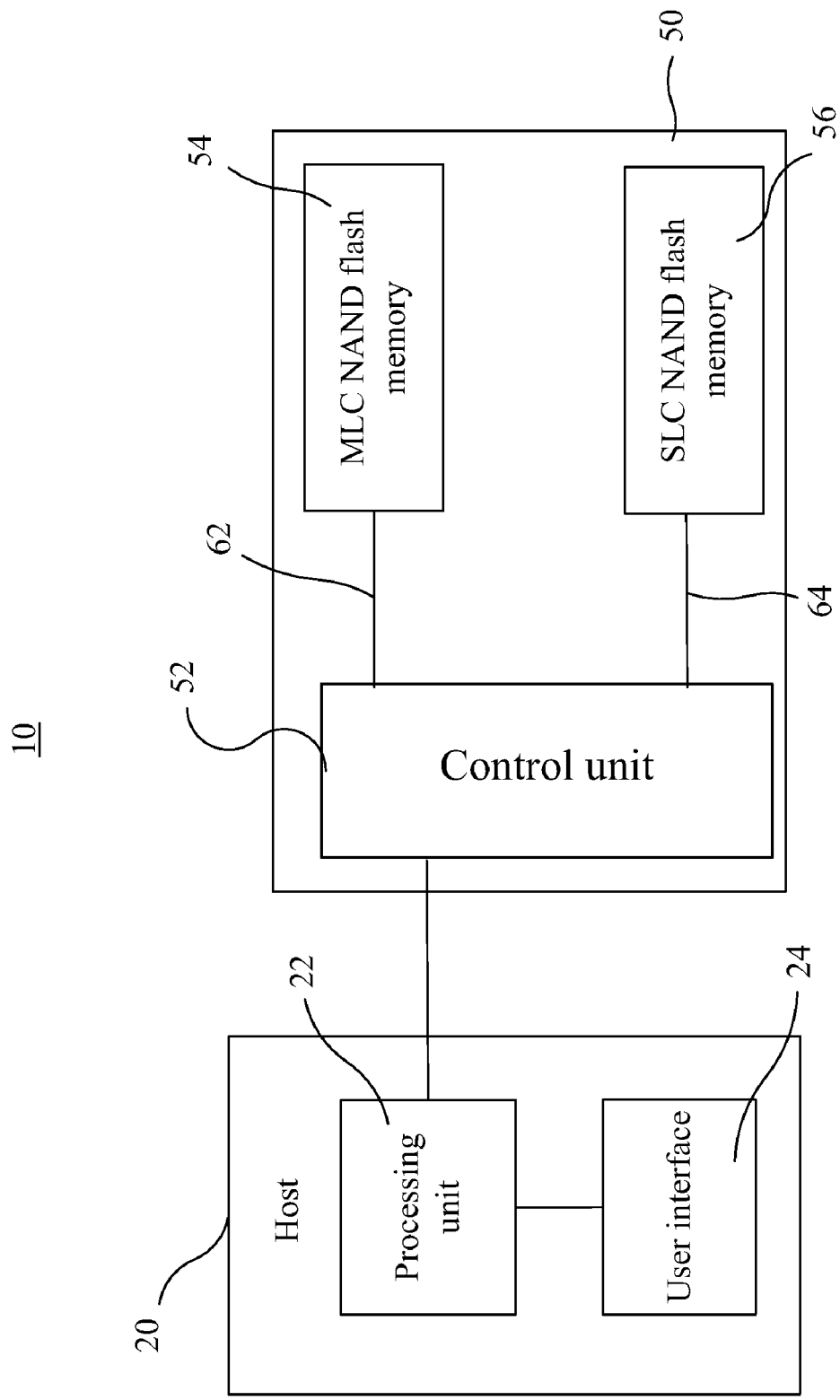
FIG. 3 shows a block diagram of the storage system according to a preferred embodiment of the present invention.

Please refer to FIG. 3 which shows a block diagram of the storage system 10 according to a preferred embodiment of the present invention. The storage system 10 comprises a host 20 and a flash memory storage device 50. The host 20 may be a desktop computer, a notebook computer, an industrial computer or a recordable DVD player. The host 20 comprises a processing unit 22 for communicating between an operating system and bus drivers. The flash memory storage device 50 comprises a control unit 52, a MLC NAND flash memory 54, and a SLC NAND flash memory 56.

Figure 4:
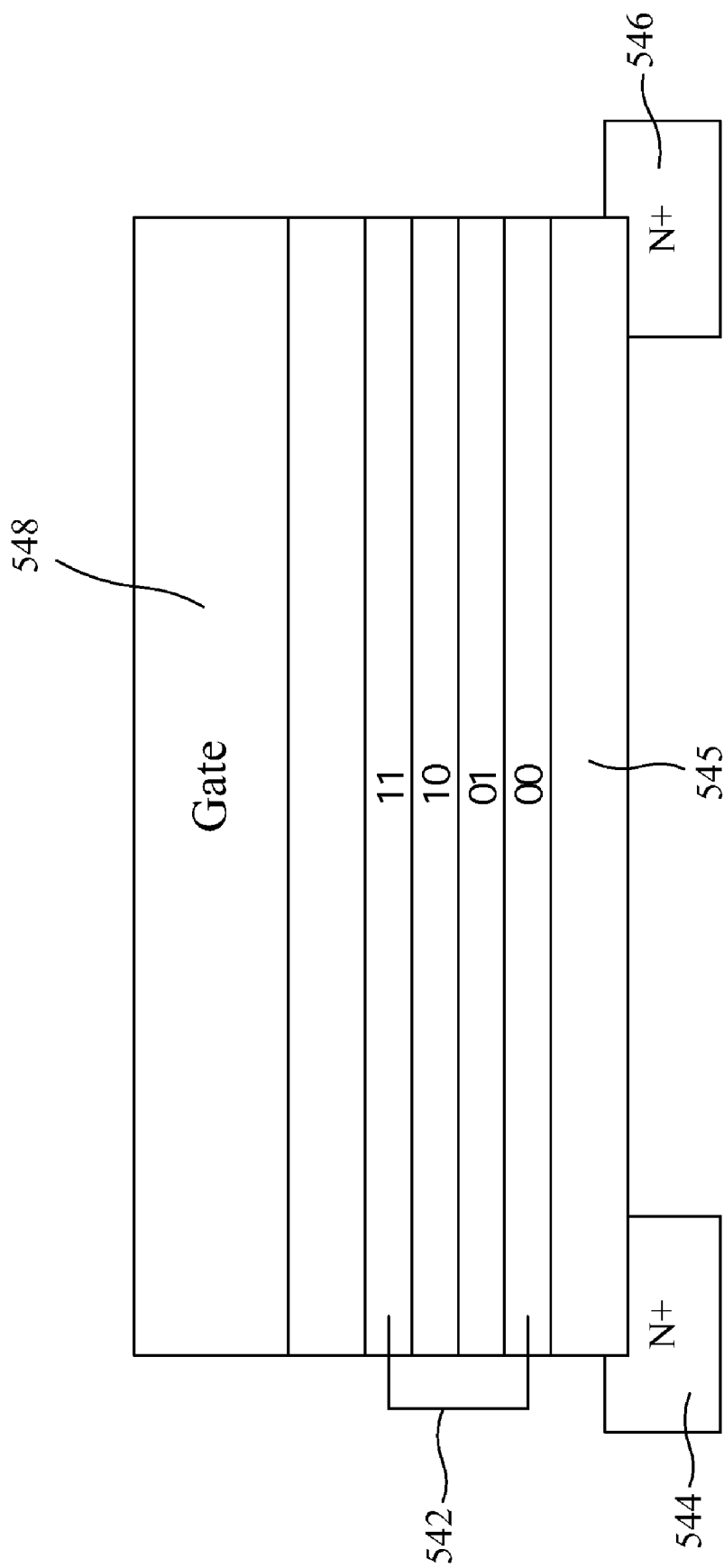
FIG. 4 depicts a cell structure of the MLC NAND flash memory.
Figure 5:
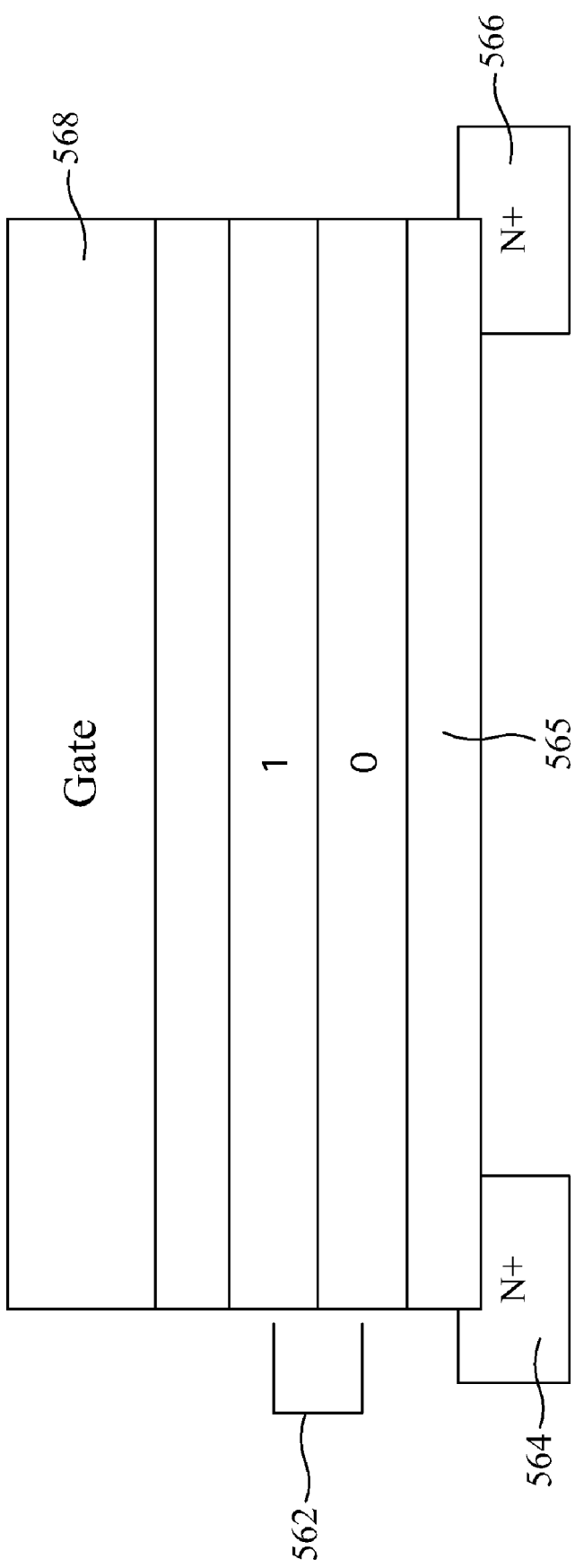
FIG. 5 illustrates a cell structure of the SLC NAND flash memory.

Please refer to FIG. 4 depicting a cell structure of the MLC NAND flash memory, and FIG. 5 illustrating a cell structure of the SLC NAND flash memory. The cell of the MLC NAND flash memory 54 comprises a floating gate 542, a source 544, a drain 546, a gate 548, and an oxide film 545. Upon charge flows from the source 544 to the cell of MLC NAND flash memory 54, the floating gate 542 may store four states indicative of four digital values 00, 01, 10, and 11. The cell of the SLC NAND flash memory 56 comprises a floating gate 562, a source 564, a drain 566, a gate 568, and an oxide film 555. The oxide film 565 sandwiched between the floating gate 562 and the source 564 is thinner, so that, during writing process, voltage is applied onto the floating gate 562, thereby the stored charge being driven to flow out through the source 564. In doing so, each SLC NAND flash memory cell may store only one-bit data.

When the flash memory storage device 50 is coupled to the host 20, the user can input command to access the flash memory storage device 50 by means of a graphic user interface 24. On receiving the user's command, the processing unit 22 sends a request to access data stored in the flash memory storage device 50. The control unit 52 will verify the location and data characteristics of the access file in response to the request. In the first embodiment, one of the file's data characteristics indicates a size of the file. If the size of the file exceeds a predetermined value, the control unit 52 sets the channel 62 to link to the MLC NAND flash memory 54, and then stores the file in the MLC NAND flash memory 54. Otherwise, the control unit 52 sets the channel 64 to link to the SLC NAND flash memory 56, and then stores the file in the SLC NAND flash memory 56. In a second embodiment, if the size of the file exceeds a predetermined value, the control unit 52 sets the channel 64 to link to the SLC NAND flash memory 56, and then stores the file in the SLC NAND flash memory 56. Otherwise, the control unit 52 sets the channel 62 to link to the MLC NAND flash memory 54, and then stores the file in the MLC NAND flash memory 54.

In the third embodiment, another one of the file's data characteristics indicates a format of the file. If the file is a video file or an audio file using such a format as JEPG, MPEG, AVI, RM etc., the control unit 52 sets the channel 62 to link to the MLC NAND flash memory 54, and then stores the file in the MLC NAND flash memory 54. If the file is a configuration file which may be a key file, the control unit 52 sets the channel 64 to link to the SLC NAND flash memory 56, and then stores the file in the SLC NAND flash memory 56. In a fourth embodiment, if the file is a video file or an audio file using a format such as JEPG, MPEG, AVI, RM etc., the control unit 52 sets the channel 64 to link to the SLC NAND flash memory 56, and then stores the file in the SLC NAND flash memory 56. If the file is a configuration file which may be a key file, the control unit 52 sets the channel 62 to link to the MLC NAND flash memory 54, and then stores the file in the MLC NAND flash memory 54.

In contrast to prior art, the flash memory storage device of the present invention provides both the MLC NAND flash memory and the SLC NAND flash memory. The control unit can determine to store a file into the MLC NAND flash memory or the SLC NAND flash memory based on the file's data characteristics. In this way, the present invention flash memory storage device can boost efficiency in accessing flash memory.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A flash memory storage device for boosting efficiency in accessing flash memory, comprising:
   a multi-level cell (MLC) flash memory for storing data;
   a single-level cell (SLC) flash memory for storing data; and
   a control unit for determining whether to store a file into the MLC NAND flash memory or the SLC NAND flash memory based on the file's data characteristics comprising a size of the file, wherein if the size of the file exceeds a predetermined value, the control unit controls the file to store in the MLC NAND flash memory, otherwise, the control unit controls the file to store in the SLC NAND flash memory.

2. The flash memory storage device as claimed in claim 1, wherein another one of the file's data characteristics comprises a format of the file.

3. The flash memory storage device as claimed in claim 2, wherein if the file's data characteristics is a video file or an audio file, then the control unit controls the file to store in the MLC NAND flash memory.

4. The flash memory storage device as claimed in claim 2, wherein if the file's data characteristics is a configuration file, then the control unit controls the file to store in the SLC NAND flash memory.

* * * * *